United States Patent
Paul et al.

(10) Patent No.: US 7,180,162 B2
(45) Date of Patent: Feb. 20, 2007

(54) ARRANGEMENT FOR REDUCING STRESS IN SUBSTRATE-BASED CHIP PACKAGES

(75) Inventors: Jens Paul, Dresden (DE); Martin Reiss, Ottendorf-Okrilla OT Medingen (DE)

(73) Assignee: Infineon Technologies AG, Munich (DE)

( * ) Notice: Subject to any disclaimer, the term of this patent is extended or adjusted under 35 U.S.C. 154(b) by 221 days.

(21) Appl. No.: 10/850,832

(22) Filed: May 21, 2004

(65) Prior Publication Data
US 2005/0017354 A1 Jan. 27, 2005

(30) Foreign Application Priority Data
May 21, 2003 (DE) .............................. 103 23 296

(51) Int. Cl.
*H01L 23/02* (2006.01)
*H01L 23/52* (2006.01)
*H01L 23/48* (2006.01)
*H01L 23/498* (2006.01)

(52) U.S. Cl. ...................... 257/678; 257/784; 257/780; 257/E23.063

(58) Field of Classification Search ............... 257/678, 257/784, 780, 698, E23.063
See application file for complete search history.

(56) References Cited

U.S. PATENT DOCUMENTS

| | | | |
|---|---|---|---|
| 5,218,234 A * | 6/1993 | Thompson et al. | 257/787 |
| 5,293,067 A | 3/1994 | Thompson et al. | |
| 5,391,916 A | 2/1995 | Kohno et al. | |
| 5,914,531 A * | 6/1999 | Tsunoda et al. | 257/668 |
| 5,953,589 A * | 9/1999 | Shim et al. | 438/106 |
| 6,291,264 B1 * | 9/2001 | Tang et al. | 438/106 |
| 7,005,737 B2 * | 2/2006 | Zhao et al. | 257/707 |

FOREIGN PATENT DOCUMENTS

DE  101 27010 A1  12/2002

* cited by examiner

*Primary Examiner*—Luan Thai
(74) *Attorney, Agent, or Firm*—Slater & Matsil, L.L.P.

(57) ABSTRACT

An arrangement reduces stress in substrate-based chip packages, in particular of Ball Grid Arrays (BGA) with rear-side and/or edge protection. The chip is firmly connected to a substrate, which is provided on the side that is opposite from the chip with conducting tracks and micro-balls for making electrical contact with the next-higher wiring level. Regular trench-shaped structures are introduced into the substrate on the chip side thereof and at least enclosing the chip, in order to interrupt or shift the thermally induced mechanical stress in the substrate, indicated by the chip.

19 Claims, 2 Drawing Sheets

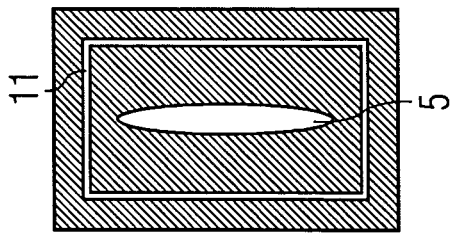
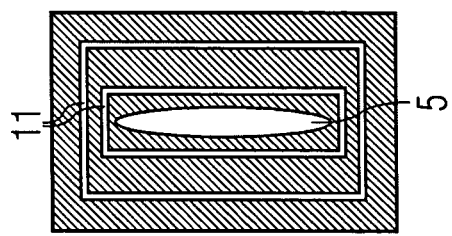
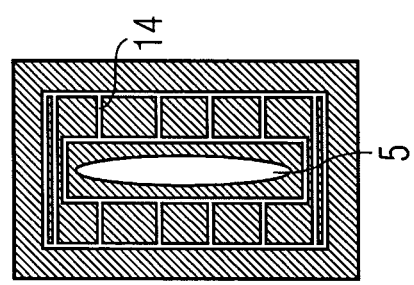
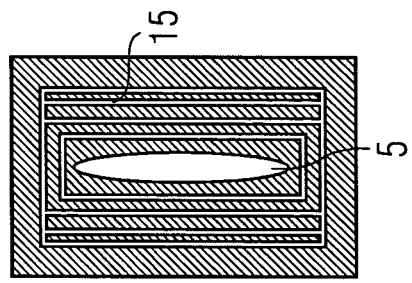
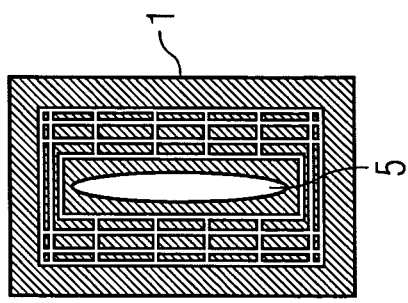

ARRANGEMENT FOR REDUCING STRESS IN SUBSTRATE-BASED CHIP PACKAGES

TECHNICAL FIELD

The invention relates to an arrangement for reducing stress in substrate-based chip packages, in particular of Ball Grid Arrays (BGA) with rear-side and/or edge protection, the chip being firmly connected to a substrate which is provided on the side that is opposite from the chip with conducting tracks and micro-balls for making electrical contact with the next-higher wiring level.

BACKGROUND

In a series of components such as BOC components or else in CSP (Chip Size Package) components, FBGA (Fine Pitch Ball Grid Array), TBGA (Tape Ball Grid Array) or μBGA components or the like, the chips are mounted on substrates which are only slightly larger than the chips mounted on them. The various designations are to some extent indications typical of the manufacturer and identify differences or subtleties in the structural design.

For the case in which it is intended to achieve an overall height that is as small as possible, the chip rear-sides are not covered, but at most only the particularly sensitive chip edges are enclosed by a moulding compound. The latter may take place by dispensing a suitable moulding compound (casting compound) around the chip edges.

If, however, the chip rear-side is also to be additionally protected at the same time, it is necessary to use complex printing or casting methods.

It can easily be appreciated that the different materials for the substrate, the chip and the casting compound have in some instances considerably different coefficients of thermal expansion, which may lead to considerable stress when the components are in use. For the substrate, use is normally made of the customary printed circuit board materials, such as hard-paper or glass-fibre materials, in particular of a multilayer design, in which synthetic resin is usually used as a binder.

Examples of such semiconductor components are found in U.S. Pat. No. 5,391,916, which describes a semiconductor component sealed with a casting compound, or in U.S. Pat. No. 5,293,067, which describes a special chip carrier for a Chip on Board (COB) component in order to reduce the mechanical stress. Both of these patent applications are incorporated herein by reference.

By suitable material selection, the coefficients of expansion can be made to match one another in a certain way, such that the difference in the coefficients of expansion between the respective material pairing becomes as small as possible. Nevertheless, the multi-layered structural design of the substrate (generally a PCB/printed circuit board) causes considerable stress.

In particular in the case of BOC or COB components, this has the grave consequence that, if they are protected with an additional mould covering, they are subjected to extreme stress during normal use. This stress is essentially based on the "bimetal effect", which results when different materials having different coefficients of expansion are joined together in layers.

In order to at least reduce the stress between the substrate and the chip, the chip is usually mounted on the substrate with a tape that compensates for thermal stresses interposed. In any event, there are then still significant differences in the respective coefficients of expansion between the silicon chip/moulding compound and moulding compound/substrate material pairings that are directly in contact with one another and in the PCB (substrate). In the worst-case situation, this may result in a separation of the connection or detachment of the micro-balls (μ balls), and consequently, possibly total failure of the component.

However, it has not been possible so far to overcome, or to overcome adequately, the effects of the thermomechanical stresses between the material pairings, and in particular in the substrate, with the result that stress-induced component failures must always be expected.

SUMMARY OF THE INVENTION

In one aspect, the invention provides an arrangement for reducing stress in substrate-based chip packages with rear-side and/or edge protection. This arrangement is simple to achieve and does not hinder the chip mounting process in any way. Advantages can be achieved in the case of an arrangement of the type stated at the beginning by regular trench-shaped structures being introduced into the substrate on the chip-side thereof and at least enclosing the chip in order to interrupt or shift thermally induced mechanical stress in the substrate.

A particular and surprising advantage of the preferred embodiment of the invention is that an effective reduction of the transfer of the stress from the chip to the substrate, and consequently, a reduction in the bending of the package, is achieved by the trench-shaped structures. This results in a considerable reduction in the stress of the solder balls (micro-balls) to the next-higher wiring level. This has the consequence of a significant improvement in the reliability of the module under thermal loading. A further advantage obtained by embodiments of the invention is that simple adaptation of the substrate design to the corresponding chip size is easily possible.

The trench-shaped structures can be etched into the substrate in a simple manner, it also being possible in principle to introduce the trench-shaped structures into the substrate by machining.

In a variant of the invention, the solder resist material on the chip-side of the substrate can be applied after introducing the trench-shaped structures into the substrate, whereby the trench-shaped structures are then filled again.

A further variant of the invention provides that, in the case of a substrate provided with a solder resist material, the trench-shaped structures are etched into the substrate through the solder resist material.

In a further development of the invention, the trench-shaped structures in the substrate enclose the chip in the form of a frame.

It is also possible to provide a number of frame-shaped structures spaced apart one inside the other, it being additionally possible to arrange between the frame-shaped structures further trenches underneath the chip, running parallel to the longitudinal or transverse edges of the latter.

A particular refinement of the invention is characterized by a combination of the previous structures, the arrangement of at least partly crossing trenches also being possible.

Embodiments of the invention achieve a differentiation of the great overall bending of the substrate into bendings of many small individual regions, whereby an easily achievable cost-neutral adaptation of the substrate to the corresponding chip size is possible without any problem.

The cost is particularly low if the trench-shaped structures are introduced into the matrix of the substrate, which leads to an optimization of the strip bending before and after moulding (casting of the individual component) with improved processability and optimization of the bending of the individually separated component with increased reliability.

BRIEF DESCRIPTION OF THE DRAWINGS

The invention is explained in more detail below on the basis of an exemplary embodiment. In the associated drawings:

FIGS. 2a–e show different arrangements of the trench-shaped structures in a substrate, the white lines schematically illustrating the position of the trench-shaped structures.

DETAILED DESCRIPTION OF ILLUSTRATIVE EMBODIMENTS

Figure 1:
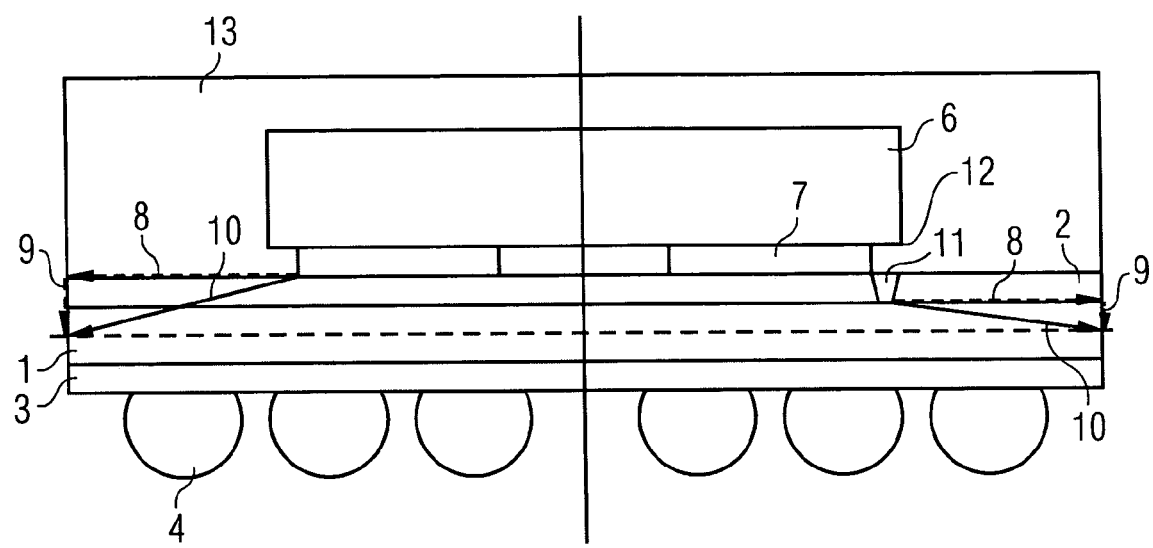
FIG. 1 shows a schematic sectional representation of a substrate-based chip package designed according to the invention with trench-shaped structures.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 shows a schematic sectional representation of a substrate-based chip package, comprising a substrate 1, which is coated on both sides with a solder resist material 2, 3 and is provided on the underside, according to the drawing, with micro-balls 4 for the electrical connection to a next-higher wiring level. The micro-balls 4 are, in this case, connected in an electrically conducting manner to conducting tracks (not represented), which for their part are electrically connected to bonding pads of a chip 6 by bonding wires (not represented), which are led through a bonding channel 5 (FIG. 2). The chip 6 is mounted on the side opposite from the micro-balls 4 of the substrate 1 with a tape 7 interposed.

FIG. 1 in this case shows, purely schematically, the customary configuration of a substrate-based chip package (prior art) in the left-hand half of the drawing figure, whereas the right-hand half of the drawing figure shows the structure changed according to the invention. Here a trench-shaped structure 11 has been introduced into the solder resist material 2 underneath the edge 12 of the chip 6, and may also extend partly into the substrate 1. The chip 6 is encapsulated here by a moulding compound 13, it also being possible for only the chip edges 12 to be protected by the moulding compound 13 and the chip rear-side to remain free.

In FIG. 1, the amount of stress under exposure to heat in the transverse direction of the substrate 8, the stress perpendicular to the substrate 9 and the stress resultant 10 are respectively entered.

It is clearly evident that the stress resultant 10 in the left-hand half of the drawing is much greater than in the right-hand half of the drawing. The reason for this is that the stress is interrupted or shifted into a more favorable position by the trench-shaped structure 11.

The trench-shaped structures 11 may be etched into the substrate 1 in a simple manner. It is also possible to introduce the trench-shaped structures 11 into the substrate 1 by machining.

In the case in which the substrate 1 is free from solder resist material 2 on the chip side within the package, the chip 6 may be bonded directly onto the substrate 1 with a tape 7 interposed.

It is also possible to initially provide the substrate 1 with the trench-shaped structures 11 and subsequently to apply the solder resist material 2 on the chip-side of the substrate 1, whereby the trench-shaped structures 11 are then filled again.

Similarly, in the case of a substrate 1 provided with a solder resist material 2, 3, the trench-shaped structures 11 may be etched into the substrate 1 through the solder resist material.

In an extremely simple refinement, the trench-shaped structures 11 in the substrate 1 enclose the chip 6 in the form of a frame (FIG. 2a), it also being possible to provide a number of frame-shaped structures 11 spaced apart one inside the other (FIG. 2b). It is additionally possible to arrange between the frame-shaped structures 11 further trenches 14, 15 underneath the chip 6, running parallel to the longitudinal or transverse edges of the latter (FIGS. 2c, d).

Finally, a combination of the structures described may also be provided, the arrangement of at least partly crossing trenches 11, 14, 15 also being possible (FIG. 2e). Other patterns and combinations are also possible. For example, the trenches could be formed with no frame at all (e.g., a series of slots or other figures).

The invention achieves a differentiation of the great overall bending of the substrate 1 into bendings of many small individual regions, whereby an easily achievable cost-neutral adaptation of the substrate to the corresponding chip size is possible without any problem.

The cost is particularly low if the trench-shaped structures are already introduced in advance into the matrix of the substrate, which leads to an optimization of the strip bending of the substrate 1 before and after moulding (casting of the individual component) with improved processability and optimization of the bending of the individually separated component with increased reliability.

An effective reduction of the transfer of the stress from the chip 6 to the substrate 1, and consequently a reduction in the bending of the package, is achieved by the trench-shaped structures 11, 14, 15. This results in a considerable reduction in the stress of the micro-balls 4 to the next-higher wiring level. This has the consequence of a significant improvement in the reliability of the module under thermal loading.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A substrate-based chip package comprising:
   a semiconductor chip; and
   a substrate including a first side connected to the semiconductor chip, the substrate including a second side that is opposite from the first side, wherein the first side of the substrate includes stress releasing trench-shaped structures formed around the periphery of the semiconductor chip, said trench-shaved structures extending from said first side and partly into, but not through said substrate, and said substrate also defining a bonding channel extending from said first side through said substrate to said second side for passing bonding wire therethrough.

2. The package of claim 1 wherein the substrate includes conducting tracks formed therein, the package further including micro-balls electrically coupled to the conducting tracks, the micro-balls for making electrical contact with the next-higher wiring level.

3. The package of claim 1 wherein the trench-shaped structures enclose the chip.

4. The package of claim 1 wherein the trench-shaped structures are provided in order to interrupt or shift thermally induced mechanical stress in the substrate.

5. The package of claim 1 wherein the trench-shaped structures are etched into the substrate.

6. The package of claim 1 wherein the trench-shaped structures are introduced by machining.

7. The package of claim 1 and further comprising a solder resist material disposed on the first side of the substrate.

8. The package of claim 7 wherein the solder resist material is applied after introducing the trench-shaped structures into the substrate.

9. The package of claim 7 wherein the trench-shaped structures are formed in the substrate through the solder resist material.

10. The package of claim 1 wherein the trench-shaped structures enclose the chip in the form of a frame.

11. The package of claim 10 wherein the trench-shaped structures comprise a number of frame-shaped structures spaced apart one inside the other.

12. The package of claim 1 wherein the trench-shaped structures are at least partly filled by a moulding compound.

13. The package of claim 1 wherein the trench-shaped structures are introduced into a matrix of the substrate.

14. The arrangement of claim 13 wherein the chip package comprises a Ball Grid Array (BGA) with rear-side and/or edge protection.

15. A substrate-based chip package comprising:
a semiconductor chip;
a substrate including a first side connected to the semiconductor chip, the substrate including a second side that is opposite from the first side. wherein the first side of the substrate includes a number of frame-shaped trench structures spaced apart and one inside the other in a periphery around the semiconductor chip; and
further trenches arranged between the frame-shaped trench structures underneath the chip.

16. The package of claim 15 wherein the further trenches run parallel to the longitudinal edges of the chip.

17. The package of claim 15 wherein the further trenches run parallel to the transverse edges of the chip.

18. The package of claim 15 wherein some of the further trenches run parallel to the longitudinal edges of the chip and wherein others of the further trenches run parallel to the transverse edges of the chip.

19. An arrangement for reducing stress in substrate-based chip packages, the chip being firmly connected to a substrate which is provided on the side that is opposite from the chip with conducting tracks and micro-balls for making electrical contact with the next-higher wiring level, characterized in that regular trench-shaped structures extending partly into, but not through the substrate on the chip-side thereof and at least enclose the chip, in order to interrupt or shift the thermally induced mechanical stress in the substrate, indicated by the chip. and said substrate defining a bonding channel extending through said substrate for passing bonding wires therethrough.

* * * * *